(12) United States Patent
Iwakaji et al.

(10) Patent No.: US 12,538,535 B2
(45) Date of Patent: Jan. 27, 2026

(54) SEMICONDUCTOR DEVICE HAVING SEMICONDUCTOR REGIONS OF ALTERNATING CONDUCTIVITY TYPES, ONE OF WHICH HAS A PEAK IN IMPURITY CONCENTRATION LOCATED BETWEEN GATE ELECTRODES OF THE SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Yoko Iwakaji, Tokyo (JP); Tomoko Matsudai, Tokyo (JP); Hiroko Itokazu, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 338 days.

(21) Appl. No.: 18/159,407

(22) Filed: Jan. 25, 2023

(65) Prior Publication Data

US 2024/0063264 A1    Feb. 22, 2024

(30) Foreign Application Priority Data

Aug. 22, 2022    (JP) .................. 2022-131922

(51) Int. Cl.
*H01L 29/96*    (2006.01)
*H01L 29/36*    (2006.01)
(Continued)

(52) U.S. Cl.
CPC ......... *H10D 62/127* (2025.01); *H10D 12/481* (2025.01); *H10D 62/60* (2025.01); *H10D 64/513* (2025.01)

(58) Field of Classification Search
CPC .... H10D 62/127; H10D 12/481; H10D 62/60; H10D 64/513
See application file for complete search history.

(56) References Cited

U.S. PATENT DOCUMENTS

| 6,342,709 B1 | 1/2002 | Sugawara et al. |
| 10,468,510 B2 | 11/2019 | Kitamura |

(Continued)

FOREIGN PATENT DOCUMENTS

| JP | H10-98188 A | 4/1998 |
| JP | 2005-116822 A | 4/2005 |

(Continued)

OTHER PUBLICATIONS

Luo, Peng et al. "Dynamic Avalanche Free Design in 1.2kV Si-IGBTs for Ultra High Current Density Operation," 2019 IEEE International Electron Devices Meeting (IEDM), San Francisco, CA, USA, 2019, pp. 12.3.1-12.3.4.

(Continued)

*Primary Examiner* — Tracie Y Green
(74) *Attorney, Agent, or Firm* — Kim & Stewart LLP

(57) ABSTRACT

According to one embodiment, a semiconductor device includes a first electrode, a second electrode, a third electrode, a semiconductor member, and an insulating member. The semiconductor member includes a first semiconductor region of a first conductivity type, a second semiconductor region of a second conductivity type, a third semiconductor region of the first conductivity type, a fourth semiconductor region of the first conductivity type, a fifth semiconductor region of the second conductivity type, and a sixth semiconductor region of the second conductivity type. The fifth semiconductor region includes a fourth partial region and a fifth partial region. The fourth partial region is located between the first partial region and the third electrode in a first direction. The fifth partial region is located between the (Continued)

third partial region and the fourth semiconductor region in the first direction.

17 Claims, 7 Drawing Sheets

(51) Int. Cl.
*H01L 29/423* (2006.01)
*H10D 12/00* (2025.01)
*H10D 62/10* (2025.01)
*H10D 62/60* (2025.01)
*H10D 64/27* (2025.01)

(56) References Cited

U.S. PATENT DOCUMENTS

| | | |
|---|---|---|
| 10,593,792 B2 | 3/2020 | Watanabe |
| 10,615,272 B2 | 4/2020 | Vellei et al. |
| 2003/0042537 A1* | 3/2003 | Nakamura ............ H10D 12/441 257/E29.198 |
| 2006/0289928 A1 | 12/2006 | Takaya et al. |
| 2017/0040446 A1 | 2/2017 | Saito et al. |
| 2018/0286971 A1 | 10/2018 | Philippou et al. |
| 2019/0140091 A1 | 5/2019 | Kinoshita et al. |
| 2019/0371889 A1* | 12/2019 | Narita .................. H10D 30/668 |
| 2021/0288156 A1 | 9/2021 | Fukui et al. |
| 2022/0157976 A1* | 5/2022 | Konishi ............... H10D 64/112 |
| 2023/0071170 A1 | 3/2023 | Matsui et al. |
| 2023/0307529 A1* | 9/2023 | Kim ..................... H10D 12/031 |
| 2024/0096965 A1* | 3/2024 | Mitsuzuka ........... H10D 62/145 |

FOREIGN PATENT DOCUMENTS

| | | |
|---|---|---|
| JP | 2010-219361 A | 9/2010 |
| JP | 5443670 B2 | 3/2014 |
| JP | 2016-115847 A | 6/2016 |
| JP | 2017-028250 A | 2/2017 |
| JP | 6208579 B2 | 10/2017 |
| JP | 2018-182313 A | 11/2018 |
| JP | 2019-054043 A | 4/2019 |
| JP | 2019-110288 A | 7/2019 |
| WO | 2017/182864 A1 | 10/2017 |
| WO | 2020/078626 A1 | 4/2020 |
| WO | 2022/123923 A1 | 6/2022 |

OTHER PUBLICATIONS

Rahman, M. T. et al. "A novel carrier accumulating structure for 1200V IGBTs without negative capacitance and decreasing breakdown-voltage," 2018 IEEE 30th International Symposium on Power Semiconductor Devices and ICs (ISPSD), May 13-17, 2018, Chicago, IL, USA, pp. 491-494.

Takaya, H. et al. "Floating Island and Thick Bottom Oxide Trench Gate MOSFET (FITMOS)—A 60V Ultra Low On-Resistance Novel MOSFET with Superior Internal Body Diode," Proceedings. ISPSD '05. The 17th International Symposium on Power Semiconductor Devices and ICs, 2005, Santa Barbara, CA, USA, 2005, pp. 1-4.

Notice of Reasons for Refusal mailed Jun. 13, 2025 in corresponding Japanese Patent Application No. 2022-131922, 17 pages (with Translation).

* cited by examiner

SEMICONDUCTOR DEVICE HAVING SEMICONDUCTOR REGIONS OF ALTERNATING CONDUCTIVITY TYPES, ONE OF WHICH HAS A PEAK IN IMPURITY CONCENTRATION LOCATED BETWEEN GATE ELECTRODES OF THE SEMICONDUCTOR DEVICE

CROSS-REFERENCE TO RELATED APPLICATIONS

This application is based upon and claims the benefit of priority from Japanese Patent Application No. 2022-131922, filed on Aug. 22, 2022; the entire contents of which are incorporated herein by reference.

FIELD

Embodiments described herein generally relate to a semiconductor device and a method for manufacturing the same.

BACKGROUND

For example, in a semiconductor device such as a transistor, stable characteristics are desired.

DETAILED DESCRIPTION

Figure 1:
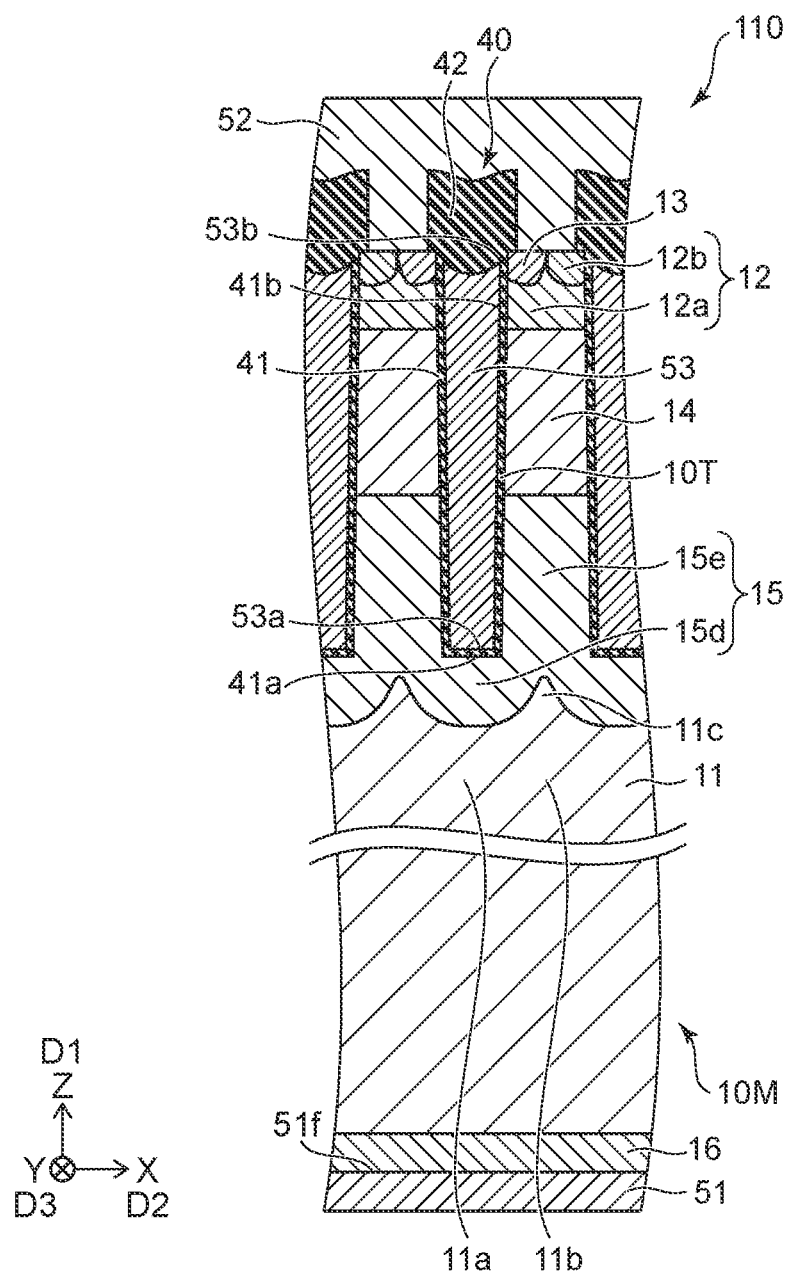
FIG. 1 is a schematic cross-sectional view illustrating a semiconductor device according to a first embodiment.

According to one embodiment, a semiconductor device includes a first electrode, a second electrode, a third electrode, a semiconductor member, and an insulating member. A direction from the first electrode to the second electrode is along a first direction. The third electrode is located between the first electrode and the second electrode. The semiconductor member includes a first semiconductor region of a first conductivity type, a second semiconductor region of a second conductivity type, a third semiconductor region of the first conductivity type, a fourth semiconductor region of the first conductivity type, a fifth semiconductor region of the second conductivity type, and a sixth semiconductor region of the second conductivity type. The first semiconductor region includes a first partial region, a second partial region, and a third partial region. The first partial region is between the first electrode and the third electrode in the first direction. A second direction from the first partial region to the second partial region crosses the first direction. The third partial region is between the second partial region and the second electrode in the first direction. The second semiconductor region is provided between the third partial region and the second electrode. The second semiconductor region includes a first semiconductor portion. The third semiconductor region is provided between the first semiconductor portion and the second electrode, and is electrically connected to the second electrode. The fourth semiconductor region is provided between the third partial region and the second semiconductor region in the first direction. The fifth semiconductor region includes a fourth partial region and a fifth partial region. The fourth partial region is located between the first partial region and the third electrode in the first direction. The fifth partial region is located between the third partial region and the fourth semiconductor region in the first direction. A direction from a part of the third electrode to the fifth partial region is along the second direction. The fifth partial region is continuous with the fourth partial region. The sixth semiconductor region is provided between the first electrode and the first semiconductor region. The insulating member includes a first insulating region. The first insulating region is provided between the semiconductor member and the third electrode.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, a semiconductor device 110 according to the embodiment includes a first electrode 51, a second electrode 52, a third electrode 53, a semiconductor member 10M and an insulating member 40.

A direction from the first electrode 51 to a second electrode 52 is along a first direction D1. The first direction D1 is defined as a Z-axis direction. A direction perpendicular to the Z-axis direction is defined as an X-axis direction. The direction perpendicular to the Z-axis direction and the X-axis direction is defined as a Y-axis direction.

The third electrode 53 is located between the first electrode 51 and the second electrode 52.

The semiconductor member 10M includes a first semiconductor region 11 of a first conductivity type, a second semiconductor region 12 of a second conductivity type, a third semiconductor region 13 of the first conductivity type, a fourth semiconductor region 14 of the first conductivity type, a fifth semiconductor region 15 of the second conductivity type, and a sixth semiconductor region 16 of the second conductivity type.

For example, the first conductivity type is n-type and the second conductivity type is p-type. In the embodiment, the first conductivity type may be p-type and the second conductivity type may be n-type. In the following, the first conductivity type is assumed to be n-type and the second conductivity type is assumed to be p-type.

The first semiconductor region 11 is, for example, an n--base layer. The first semiconductor region 11 includes, for example, a first partial region 11a, a second partial region 11b, and a third partial region 11c. The first partial region 11a is located between the first electrode 51 and the third electrode 53 in the first direction D1. A second direction D2 from the first partial region 11a to the second partial region 11b crosses the first direction D1. The second direction D2 is, for example, the X-axis direction. A region overlapping the third electrode 53 in the first direction D1 corresponds to the first partial region 11a. The second partial region 11b does not overlap the third electrode 53 in the first direction D1.

The third partial region 11c is located between the second partial region 11b and the second electrode 52 in the first direction D1. When the first electrode 51 is used as a reference, the height of the third partial region 11c is higher than the height of the second partial region 11b. When the first electrode 51 is used as a reference, the height of the third partial region 11c is higher than the height of the first partial region 11a.

At least a part of the second semiconductor region 12 is, for example, a p-base layer. The second semiconductor region 12 is provided between the third partial region 11c and the second electrode 52. The second semiconductor region 12 includes a first semiconductor portion 12a. The first semiconductor portion 12a is, for example, the p-base layer. As shown in FIG. 1, the second semiconductor region 12 may further include a second semiconductor portion 12b.

The third semiconductor region 13 is, for example, an n-emitter layer. The third semiconductor region 13 is provided between the first semiconductor portion 12a and the second electrode 52 in the first direction D1. The third semiconductor region 13 is electrically connected to the second electrode 52.

The fourth semiconductor region 14 is, for example, an n-barrier layer. The fourth semiconductor region 14 is provided between the third partial region 11c and the second semiconductor region 12 in the first direction D1.

The fifth semiconductor region 15 is, for example, a p-barrier layer. The fifth semiconductor region 15 includes a fourth partial region 15d and a fifth partial region 15e. The fourth partial region 15d is located between the first partial region 11a and the third electrode 53 in the first direction D1. The fifth partial region 15e is located between the third partial region 11c and the fourth semiconductor region 14 in the first direction D1. A direction from a part of the third electrode 53 to the fifth partial region 15e is along the second direction D2.

As shown in FIG. 1, the third electrode 53 includes an end portion 53a and another end portion 53b. The end portion 53a is located between the first electrode 51 and the second electrode 52 in the first direction D1. The other end portion 53b is located between the end portion 53a and the second electrode 52 in the first direction D1. For example, when the height of the first electrode 51 is used as a reference, the height of at least a part of the fifth partial region 15e may be higher than a height of the end portion 53a of the third electrode 53. The fifth partial region 15e is continuous with the fourth partial region 15d. For example, a direction from at least a part of the fourth partial region 15d to at least a part of the third partial region 11c is along the second direction D2.

The sixth semiconductor region 16 is, for example, a p-collector layer. The sixth semiconductor region 16 is provided between the first electrode 51 and the first semiconductor region 11. For example, the sixth semiconductor region 16 may be electrically connected to the first electrode 51. For example, the sixth semiconductor region 16 may be in contact with the first electrode 51. The first electrode 51 may include a first face 51f. The first face 51f faces the sixth semiconductor region 16. The first direction D1 crosses the first face 51f. The first direction D1 is perpendicular to the first face 51f, for example.

As shown in FIG. 1, the insulating member 40 includes a first insulating region 41. The first insulating region 41 is provided between the semiconductor member 10M and the third electrode 53. The first insulating region 41 electrically insulates between the semiconductor member 10M and the third electrode 53. The first insulating region 41 may include a first insulating portion 41a. The first insulating portion 41a is provided between the fourth partial region 15d and the third electrode 53 in the first direction D1.

For example, the first insulating region 41 may include a second insulating portion 41b. The second insulating portion 41b is provided between the third electrode 53 and the third semiconductor region 13, between the third electrode 53 and the second semiconductor region 12, between the third electrode 53 and the fourth semiconductor region 14, and between the third electrode 53 and the fifth partial region 15e in the second direction D2.

For example, a current flowing between the first electrode 51 and the second electrode 52 can be controlled by a potential of the third electrode 53. The potential of the third electrode 53 may be, for example, a potential based on a potential of the second electrode 52. The first electrode 51 is, for example, a collector electrode. The second electrode 52 is, for example, an emitter electrode. The third electrode 53 is, for example, a gate electrode. The semiconductor device 110 is, for example, an insulated gate bipolar transistor (IGBT). At least a part of the second insulating portion 41b may function as a gate insulating film. The semiconductor device 110 is, for example, a power semiconductor switching device.

As shown in FIG. 1, for example, a trench 10T is provided in the semiconductor member 10M. The third electrode 53 is provided inside the trench 10T. The fourth partial region 15d of the fifth semiconductor region 15 is provided below the trench 10T. The fifth partial region 15e of the fifth semiconductor region 15 is provided in a region where the trench 10T is not provided. The fourth semiconductor region 14, the second semiconductor region 12, and the third semiconductor region 13 are provided on the fifth partial region 15e in this order.

In the semiconductor device 110, the fifth semiconductor region 15 is provided. As a result, the operation is stabilized, for example, in the region corresponding below the third electrode 53, as described below. For example, an avalanche breakdown being easy to occur at the bottom of the trench 10T can be suppressed. According to the embodiment, a semiconductor device capable of obtaining stable characteristics can be provided. According to embodiments, for example, breakdown can be suppressed.

For example, in the on-operation of the IGBT, a positive bias is applied to the gate electrode. Thereby, for example, electrons are injected from the n-emitter layer to the n--base layer. On the other hand, for example, holes are injected from the p-collector layer into the n--base layer. Thereby, the on-state is obtained. In IGBTs, it is desired to increase the current density to increase the current. For example, by increasing the area of the current path per unit area, the current density can be increased. When the current density is increased, the breakdown of the device tends to occur. For example, a dynamic avalanche breakdown is generated in the IGBT at the time of turn-off, and an overcurrent continues to flow. As a result, the device may be broken.

For example, in a first reference example, a floating (independent) p-layer is provided at the bottom of the trench 10T. In the first reference example, a depletion layer extends from the junction of the floating p-layer and the n--base layer at the time of turn-off. Thereby, the electric field concentration at the bottom of the trench 10T is reduced. In the first reference example, it was found that the avalanche breakdown is likely to occur at the bottom of the trench 10T at the time of turn-off.

On the other hand, in a second reference examples, a p-layer having uniform thickness and including the bottom of the trench 10T is provided parallel to the n--base layer. In the second reference example, the depletion occurs at the junction of the region of the p-layer away from the bottom of the trench 10T and the n-base layer. In the second reference example, it is considered that the electric field concentration at the bottom of the trench 10T is reduced. In the second reference example in which a uniform p-layer is applied, it is not practically easy to form the uniform p-layer. For example, when the trench 10T is deep, ion implantation at high acceleration is required to form the p-layer. For example, an ion implantation of long time is required. In the second reference example, for example, a diffusion by annealing at a high temperature is required. In the second reference example, when trying to increase the impurity concentration (carrier concentration) at the bottom of the trench 10T, the impurity concentration (carrier concentration) in the p-layer except for the bottom of the trench 10T also increases together with others. Therefore, when the electric field concentration is sufficiently reduced, electrons are hardly injected from the n-barrier layer to the n--base layer through the p-barrier layer. As a result, the on-voltage is increased.

In the embodiment, instead of providing a uniform p-layer, the fourth partial region 15d and the fifth partial region 15e are provided. For example, the profile of the impurity concentration (carrier concentration) in the fourth partial region 15d can be controlled independently of the profile of the impurity concentration (carrier concentration) in the fifth partial region 15e. For example, the concentration of the electric field can be effectively suppressed by the fourth partial region 15d. The increase of on-resistance can be suppressed.

For example, at turn-off, depletion occurs between the fourth partial region 15d (a part of the p-barrier layer) and the first partial region 11a (a part of the n--base layer). For example, at turn-off, depletion begins at the junction between the fifth partial region 15e (another part of the p-barrier layer) and the third partial region 11c (another part of the n--base layer). Depletion begins at a position away from the bottom of the trench 10T. The electric field concentration is reduced and the breakdown resistance is improved.

In the embodiment, the profile of the impurity concentration (carrier concentration) in the thickness direction in the fourth partial region 15d may be independent of the profile of the impurity concentration (carrier concentration) in the thickness direction in the fifth partial region 15e. For example, as will be described later, impurities for forming the fourth partial region 15d are introduced into the bottom of the trench 10T. Separately, impurities for forming the fifth partial region 15e are introduced. According to the embodiment, even when the trench 10T is deep, the semiconductor device 110 can be manufactured in a short time. According to the embodiment, a semiconductor device capable of obtaining stable characteristics can be manufactured with high productivity.

In the embodiment, for example, the first semiconductor region 11 may contact the sixth semiconductor region 16. For example, the fifth semiconductor region 15 may contact the first semiconductor region 11. For example, the fourth semiconductor region 14 may contact the fifth semiconductor region 15. For example, the second semiconductor region 12 may contact the fourth semiconductor region 14. For example, the third semiconductor region 13 may contact the second semiconductor region 12. The second electrode 52 may contact the third semiconductor region 13.

For example, a third impurity concentration of the first conductivity type in the third semiconductor region 13 is higher than a first impurity concentration of the first conductivity type in the first semiconductor region 11. The first semiconductor region 11 is an n--layer. The third semiconductor region 13 is an n-layer or an n+-layer. The first impurity concentration is, for example, not less than $1 \times 10^{10}$ cm−3 and not more than $1 \times 10^{15}$ cm−3. The third impurity concentration is, for example, not less than $1 \times 10^{16}$ cm−3 and not more than $1 \times 10^{20}$ cm−3.

For example, a fourth impurity concentration of the first conductivity type in the fourth semiconductor region 14 may be higher than the first impurity concentration of the first conductivity type in the first semiconductor region 11. The fourth semiconductor region 14 may be, for example, an n-layer. The fourth impurity concentration is, for example, not less than $1 \times 10^{12}$ cm−3 and not more than $1 \times 10^{17}$ cm−3.

As shown in FIG. 1, the second semiconductor region 12 may further include the second semiconductor portion 12b. The third semiconductor region 13 is located between the third electrode 53 and the second semiconductor portion 12b in the second direction D2. The second semiconductor portion 12b is electrically connected to the second electrode 52. The second semiconductor portion 12b is, for example, a p-contact layer.

For example, an impurity concentration of the second conductivity type (second semiconductor portion impurity concentration) in the second semiconductor portion 12b is higher than an impurity concentration of the second conductivity type (first semiconductor portion impurity concentration) in the first semiconductor portion 12a. The first semiconductor portion impurity concentration is, for example, not less than $1 \times 10^{15}$ cm−3 and not more than $1 \times 10^{18}$ cm−3. The second semiconductor portion impurity concentration is, for example, not less than $1 \times 10^{16}$ cm−3 and not more than $1 \times 10^{20}$ cm−3.

For example, an impurity concentration of the second conductivity type in the sixth semiconductor region 16 (sixth impurity concentration) may be higher than an impurity concentration of the second conductivity type in the fifth semiconductor region 15 (fifth impurity concentration, e.g. an average concentration). The sixth semiconductor region 16 may be, for example, a p-layer or a p+-layer. The sixth impurity concentration is, for example, not less than $1 \times 10^{15}$ cm−3 and not more than $1 \times 10^{20}$ cm−3.

In the embodiments, the semiconductor member 10M includes silicon. The semiconductor member 10M may include SiC or GaN.

As shown in FIG. 1, the insulating member 40 may further include a second insulating region 42. The second insulating region 42 is located between the third electrode 53 and the second electrode 52 in the first direction D1.

As shown in FIG. 1, a plurality of third electrodes 53 may be provided. For example, a direction from one of the plurality of third electrodes 53 to another one of the plurality of third electrodes 53 is along the second direction D2. The plurality of third electrodes 53 may extend along the Y-axis direction, for example.

A part of the plurality of third electrodes 53 may be a dummy electrode. The potential of the dummy electrode may be, for example, the same as the potential of the second electrode 52 (for example, the emitter electrode). For example, a loss (For example, a turn-on loss) in switching can be reduced.

Figure 2:
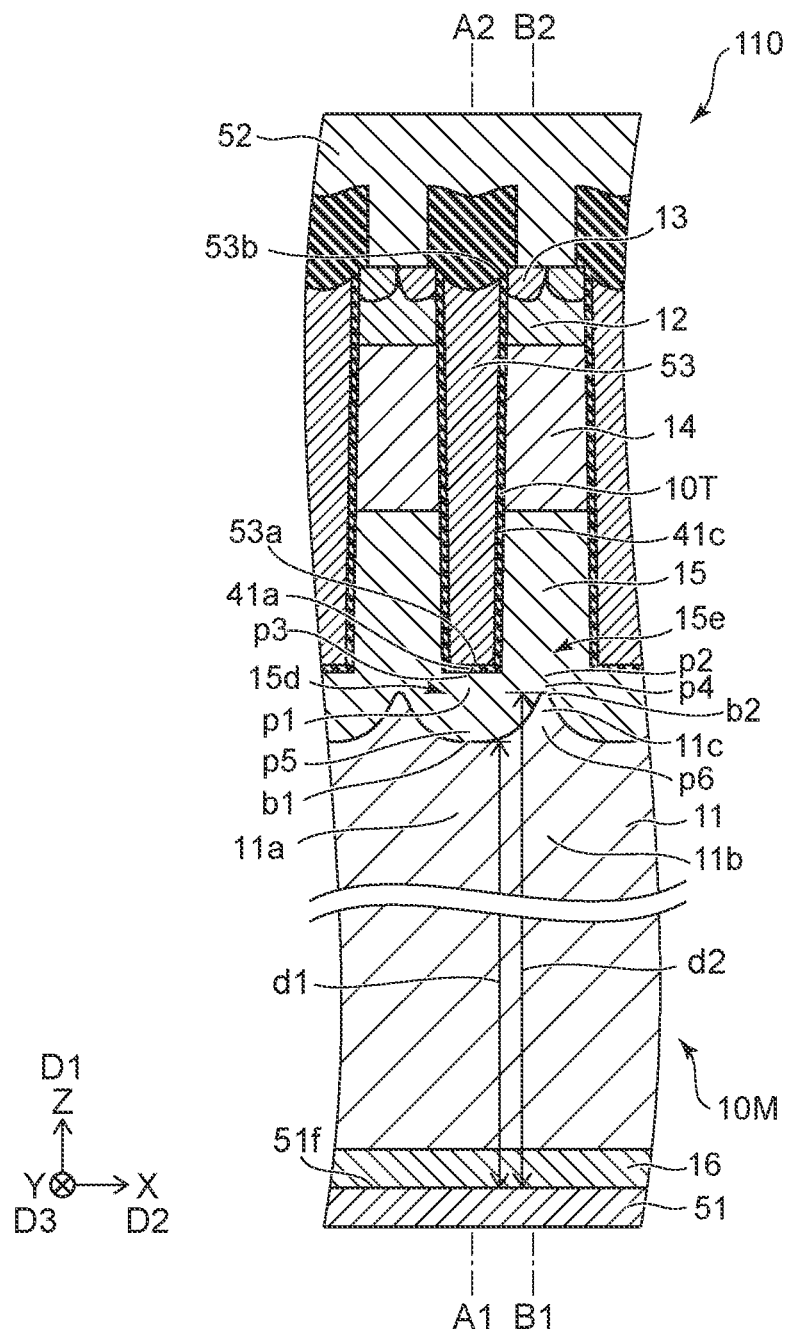
FIG. 2 is a schematic cross-sectional view illustrating the semiconductor device according to the first embodiment.

FIG. 2 is a schematic cross-sectional view illustrating the semiconductor device according to the first embodiment.

FIG. 2 shows the semiconductor device 110 illustrated in FIG. 1. As shown in FIG. 2, the semiconductor member 10M may include a first boundary b1 and a second boundary b2. The first boundary b1 is located between the first partial region 11a and the fourth partial region 15d in the first direction D1. The second boundary b2 is located between the third partial region 11c and the fifth partial region 15e in the first direction D1.

These boundaries are the boundaries between the first semiconductor region 11 and the fifth semiconductor region 15. The first boundary b1 overlaps the third electrode 53 in the first direction D1. The second boundary b2 does not overlap the third electrode 53 in the first direction D1. The second boundary b2 overlaps the fourth semiconductor region 14, the second semiconductor region 12, and the third semiconductor region 13.

As shown in FIG. 2, a distance between the first electrode 51 and the first boundary b1 along the first direction is defined as a first distance d1. A distance between the first electrode 51 and the second boundary b2 along the first direction D1 is defined as a second distance d2. In the embodiment, the first distance d1 is shorter than the second distance d2. The position in the depth direction of the boundary between the first semiconductor region 11 and the fifth semiconductor region 15 changes in the second direction D2 corresponding to the third electrode 53.

For example, as will be described later, the impurity concentration becomes local minimum at the first boundary b1 in the depth direction at a position passing through the third electrode 53. For example, as will be described later, the impurity concentration becomes local minimum at the second boundary b2 in the depth direction at a position not passing through the third electrode 53.

In the embodiment, for example, the impurity concentration of the second conductivity type in at least a part of the fourth partial region 15d is higher than the impurity concentration of the second conductivity type in at least a part of the fifth partial region 15e. For example, in the fifth semiconductor region 15 including the fourth partial region 15d and the fifth partial region 15e, the impurity concentration of the second conductivity type may be local maxim in the fourth partial region 15d.

For example, a dynamic avalanche is easy to occur at the bottom of the trench 10T. By the impurity concentration in the fourth partial region 15d being higher than the impurity concentration in the fifth partial region 15e, for example, a high breakdown resistance and a low on-voltage are easily obtained.

An example of the impurity concentration in the semiconductor member 10M will be described below.

Figure 3A:
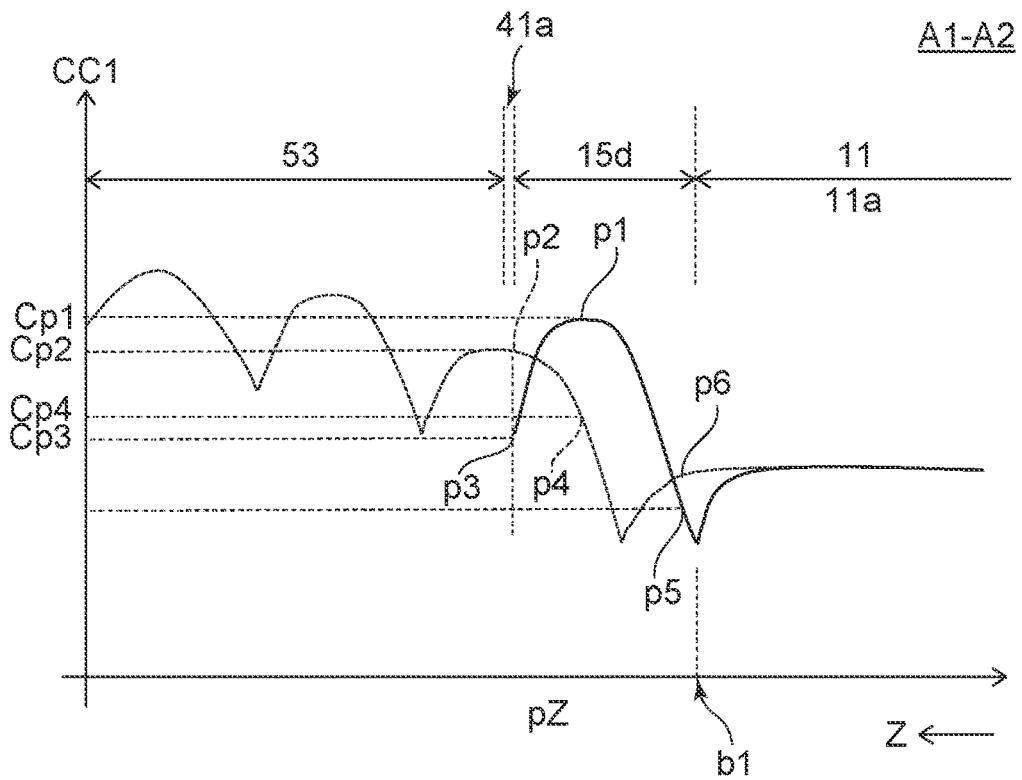
FIGS. 3A and 3B are graphs illustrating the semiconductor device according to the first embodiment.
Figure 3B:
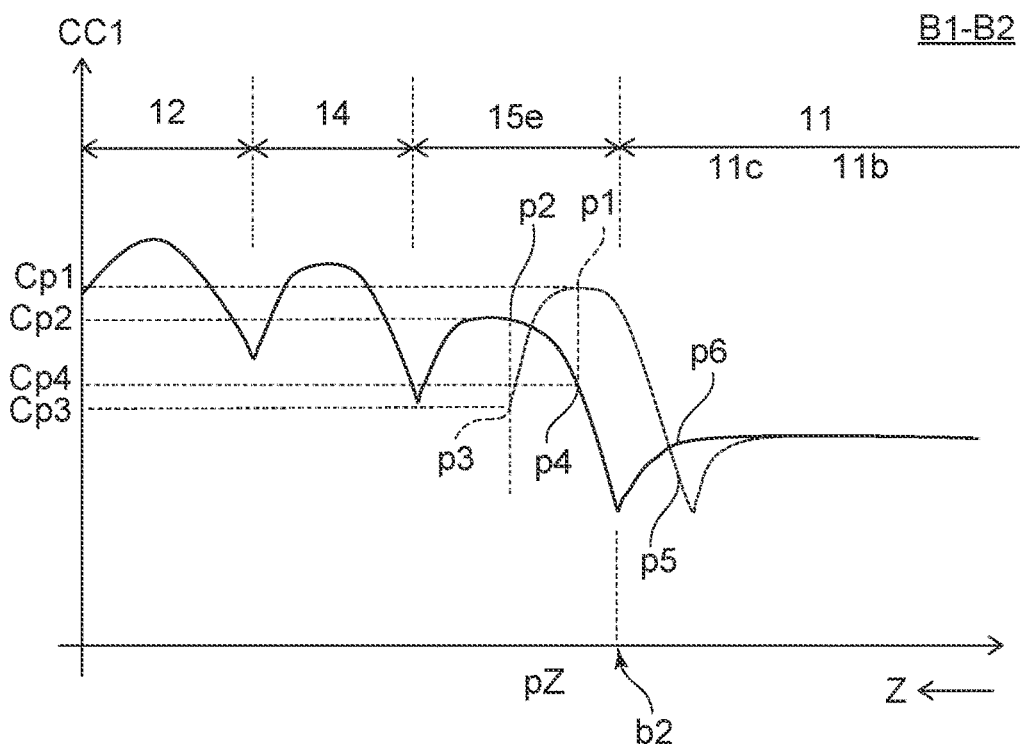

FIGS. 3A and 3B are graphs illustrating the semiconductor device according to the first embodiment.

In FIG. 3A, the impurity concentration profile on the line A1-A2 of FIG. 2 is illustrated by a solid line. In FIG. 3A, the profile of the impurity concentration in the line B1-B2 of FIG. 2 is illustrated by a dashed line. In FIG. 3B, the impurity concentration profile in the line B1-B2 of FIG. 2 is illustrated by a solid line. In FIG. 3B, the profile of the impurity concentration in the line A1-A2 of FIG. 2 is illustrated by a dashed line. The horizontal axis of these figures is the position pZ in the Z-axis direction (depth direction). The vertical axis is impurity concentration CC1. The A1-A2 line passes through the third electrode 53 and is along the first direction D1. The line B1-B2 passes through the fourth semiconductor region 14, the second semiconductor region 12, and the third semiconductor region 13, and extends along the first direction D1.

As shown in FIGS. 3A and 2, the fourth partial region 15d includes a first position p1. The first position p1 is located between the first partial region 11a and the third electrode 53 in the first direction D1. The first position p1 may be one position in the fourth partial region 15d. As shown in FIGS. 3B and 2, the fifth partial region 15e includes a second position p2. The second position p2 may be one position in the fifth partial region 15e.

As shown in FIGS. 3A and 3B, a first position impurity concentration Cp1 of the second conductivity type at the first position p1 is higher than a second position impurity concentration Cp1 of the second conductivity type at the second position p2. Thus, the impurity concentration of the second conductivity type in at least a part of the fourth partial region 15d is higher than the impurity concentration of the second conductivity type in the fifth partial region 15e.

As shown in FIG. 3A, for example, the impurity concentration of the second conductivity type in the fourth partial region 15d becomes the highest at the first position p1 in the first direction D1.

For example, when the first position impurity concentration Cp1 is the local maximum value of the impurity concentration, the first position impurity concentration Cp1 may be, for example, not less than 1.5 times and not more than 100 times the second position impurity concentration Cp2.

As shown in FIGS. 3A and 2, the fourth partial region 15d may include a third position p3. The third position p3 is located between the first position p1 and the third electrode 53 in the first direction D1. A third position impurity concentration Cp3 of the second conductivity type at the third position p3 may be lower than the first position impurity concentration Cp1.

For example, a direction from the third position p3 to the second position p2 may be along the second direction D2 (see FIG. 2). For example, the third position impurity concentration Cp3 may be lower than the second position impurity concentration Cp2. For example, the second position impurity concentration Cp2 may be not less than 2 times and not more than 100 times the third position impurity concentration Cp3.

As shown in FIGS. 3A and 2, the fifth partial region 15e may include a fourth position p4. A direction from the fourth position p4 to the second position p2 is along the first direction D1. For example, the fourth position p4 is located between the third partial region 11c and the second position p2. A direction from the first position p1 to the fourth position p4 is along the second direction D2. As shown in FIG. 3B, the second position impurity concentration Cp2 is higher than a fourth position impurity concentration Cp4 of the second conductivity type at the fourth position p4.

When the first position impurity concentration Cp1 is the local maximum value of the impurity concentration, for example, the first position impurity concentration Cp1 may be not less than 2 times and not more than 1000 times the fourth position impurity concentration Cp4. For example, the second position impurity concentration Cp1 may be not less than 2 times and not more than 1000 times the fourth position impurity concentration Cp4.

As shown in FIGS. 3A and 2, the fourth partial region 15d may include a fifth position p5. The fifth position p5 is located between the first partial region 11a and the third position p3 in the first direction D1. As shown in FIGS. 3B and 2, the third partial region 11c may include a sixth position p6. The sixth position p6 is located between the sixth semiconductor region 16 and the fourth position p4 in the first direction D1. A direction from the fifth position p5 to the sixth position p6 is along the second direction D2.

As shown in FIG. 3A, a fifth position impurity concentration of the second conductivity type at the fifth position p5 is lower than the third position impurity concentration Cp3. As shown in FIG. 3B, a sixth position impurity concentration of the first conductivity type at the sixth position p6 may be lower than the fourth position impurity concentration Cp4.

Second Embodiment

The second embodiment relates to a method for manufacturing the semiconductor device.

FIGS. 4 to 7 are schematic cross-sectional views illustrating a method for manufacturing the semiconductor device according to the second embodiment.

Figure 4:
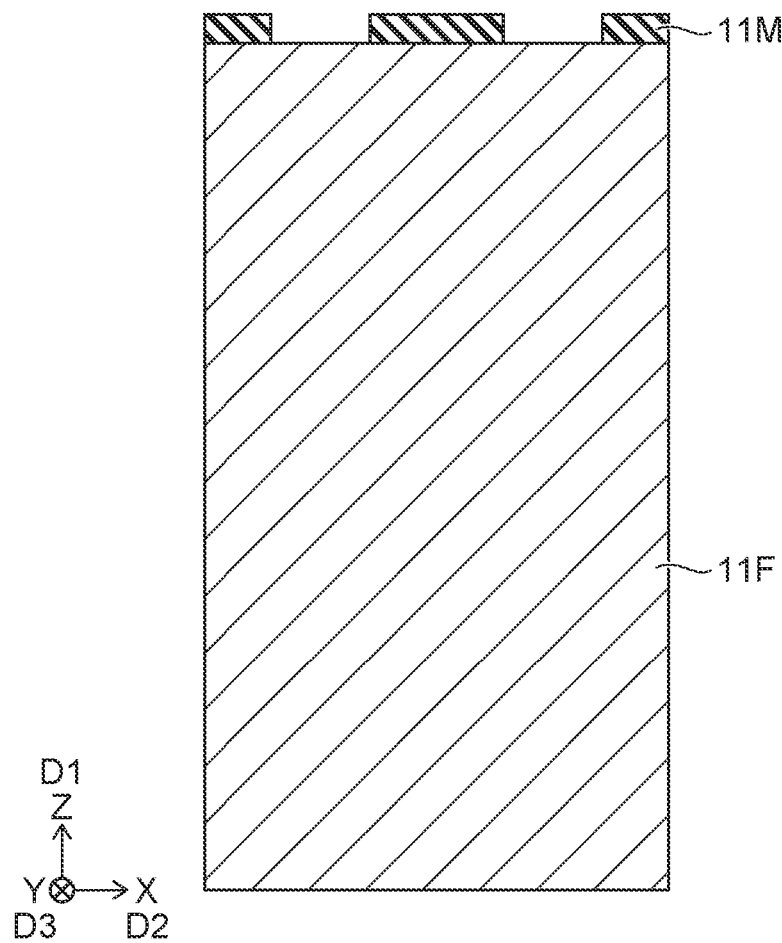
FIG. 4 is a schematic cross-sectional view illustrating a method for manufacturing the semiconductor device according to a second embodiment.

As shown in FIG. 4, a first semiconductor member 11F serving as the first semiconductor region 11 of the first conductivity type is prepared. The first semiconductor member 11F includes, for example, silicon. The first semiconductor member 11F may be, for example, an n--silicon substrate. A mask member 11M is formed on a part of the first semiconductor member 11F. For example, a film serving as the mask member 11M may be formed of TEOS (Tetraethoxysilane) or the like. A part of the film serving as the mask member 11M is removed by, for example, photolithography and etching. Thereby, an opening is provided in the mask member 11M.

Figure 5:
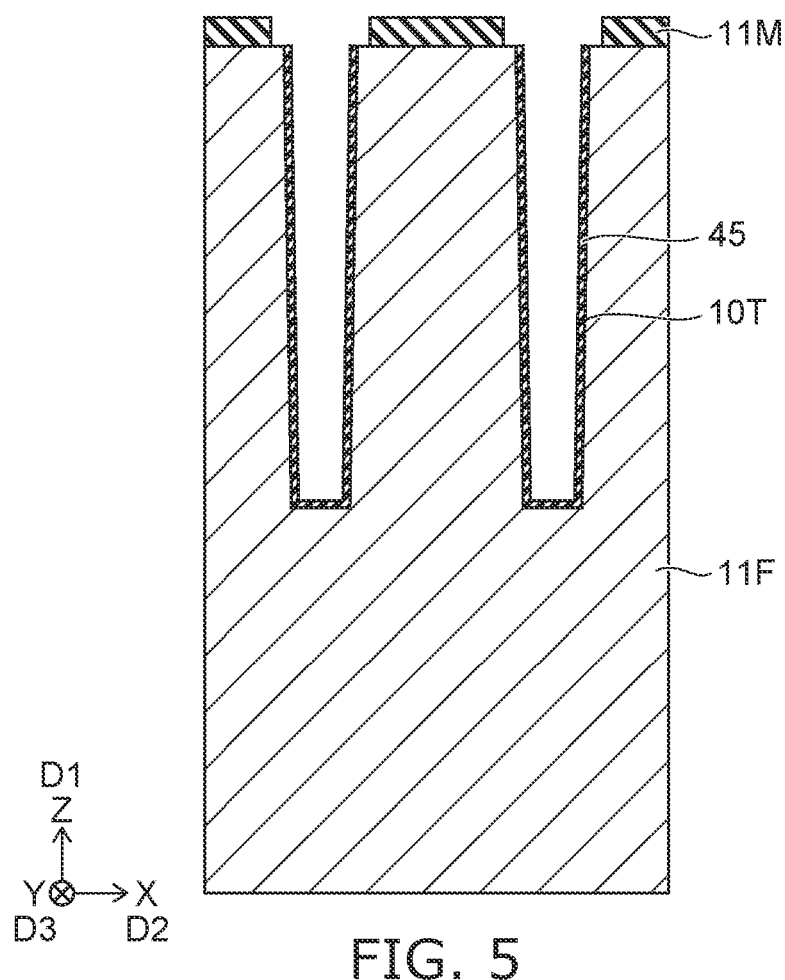
FIG. 5 is a schematic cross-sectional view illustrating the method for manufacturing the semiconductor device according to the second embodiment.

As shown in FIG. 5, a part of the first semiconductor member 11F is removed by using the mask member 11M as a mask. Thereby, the trench 10T is formed in the first semiconductor member 11F. The first semiconductor member 11F is partially removed by dry etching, for example.

Thereafter, an insulating film 45 is formed inside the trench 10T. The insulating film 45 may be formed by thermal oxidation, for example. The thickness of the insulating film 45 may be, for example, not less than 10 nm and not more than 80 nm.

Figure 6:
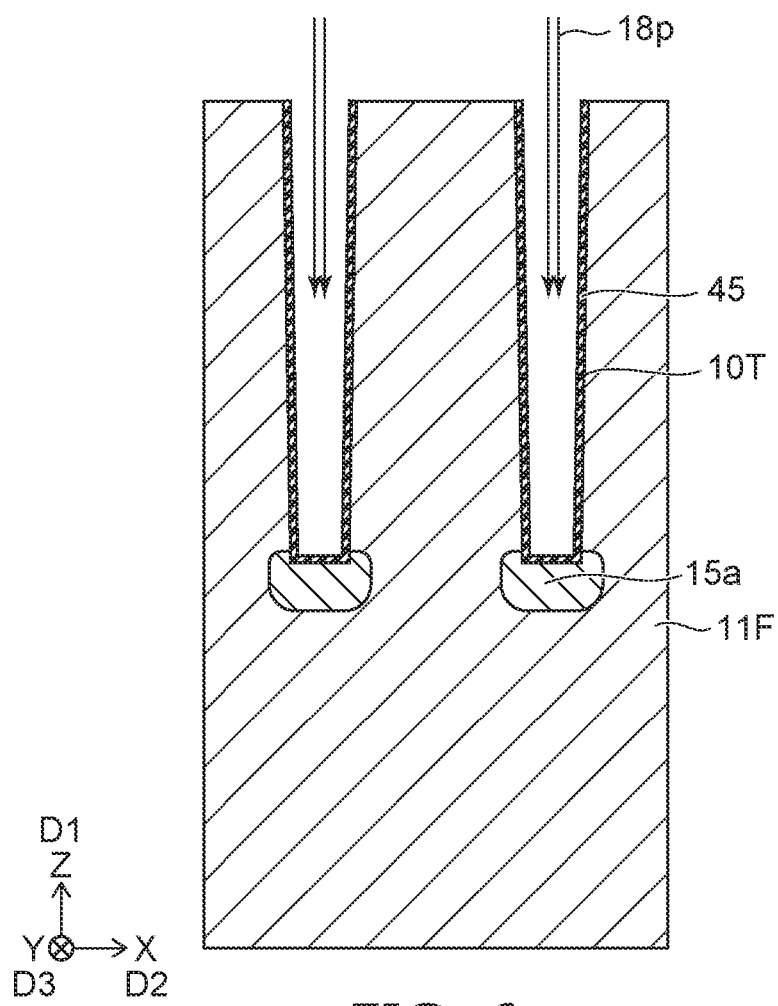
FIG. 6 is a schematic cross-sectional view illustrating the method for manufacturing the semiconductor device according to the second embodiment.

As shown in FIG. 6, an impurity 18p of the second conductivity type is introduced into the bottom of the trench 10T. A region 15a into which the impurity 18p of the second conductivity type is introduced corresponds to at least a part of the fourth partial region 15d. The impurity 18p of the second conductivity type is, for example, boron. The impurity 18p is introduced, for example, by ion implantation. The impurity 18p may be introduced into the entire first semiconductor member 11F.

Thus, the impurity 18p of the second conductivity type is introduced into the bottom of the trench 10T provided in the first semiconductor member 11F serving as the first semiconductor region 11 of the first conductivity type. Thereafter, the impurity 18p is activated by heat treatment. Thereby, at least a part of the fourth partial region 15d is formed. After the introducing the impurity 18p, the insulating film 45 may be removed.

Figure 7:
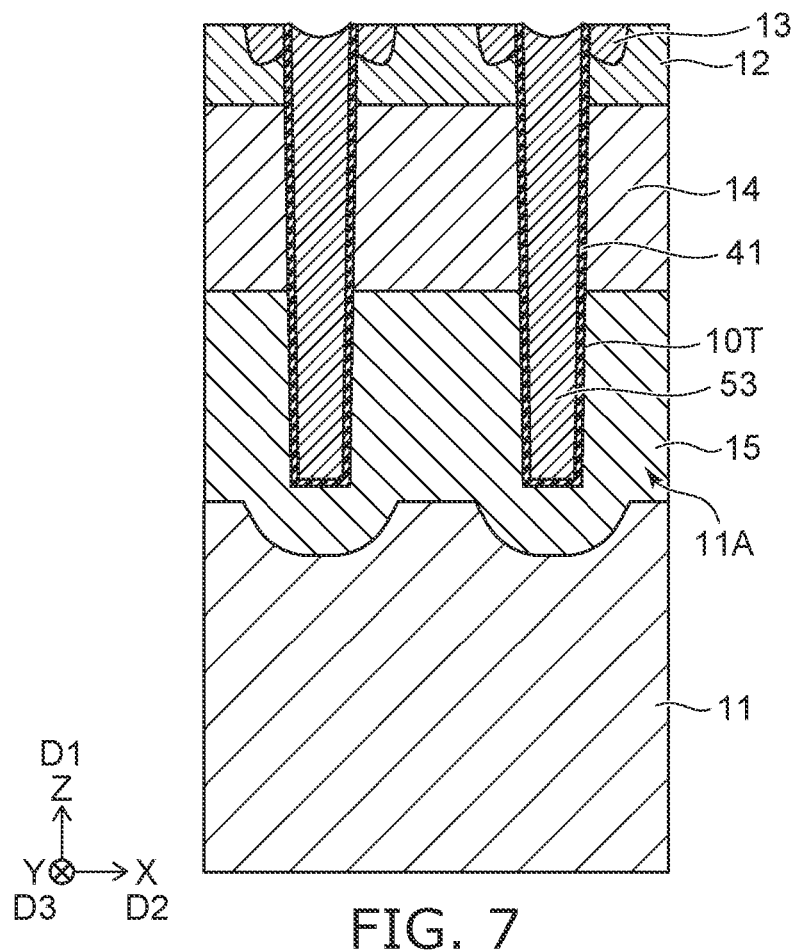
FIG. 7 is a schematic cross-sectional view illustrating the method for manufacturing the semiconductor device according to the second embodiment.

As shown in FIG. 7, the first insulating region 41 (insulating member 40) is formed in the trench 10T. The first insulating region 41 may be formed by thermal oxidation. The first insulating region 41 may be formed by CVD, for example.

A conductive member is buried in the remaining space inside the trench 10T. The conductive member may be, for example, polysilicon. The third electrode 53 is formed by the conductive member.

As shown in FIG. 7, the other portion 11A of the first semiconductor member 11F is a region (for example, a mesa region) in which the trench 10T is not formed. The impurity of the second conductivity type and the impurity of the first conductivity type are introduced into the other portion 11A of the first semiconductor member 11F. For example, boron is introduced, phosphorus is introduced, and boron is introduced. The activation is performed by heat treatment.

Thus, from the other portion 11A, the fifth semiconductor region 15 of the second conductivity type, the fourth semiconductor region 14 of the first conductivity type, and the second semiconductor region 12 of the second conductivity type (for example, the first semiconductor portion 12a) are obtained. As a result, the first semiconductor region 11 is obtained. The fifth semiconductor region 15 is located on the first semiconductor region 11. The fourth semiconductor region 14 is located on the fifth semiconductor region 15. The second semiconductor region 12 is located on the fourth semiconductor region 14. The introduction of impurities for forming the fourth semiconductor region 14 may be omitted. In this case, the impurity concentration of the first conductivity type in the fourth semiconductor region 14 may be the same as the impurity concentration of the first semiconductor region 11.

Thereafter, an impurity of the first conductivity type is introduced to form the third semiconductor region 13 of the first conductivity type. The activation is performed by heat treatment. The third semiconductor region 13 is located on at least a part of the second semiconductor region 12. For example, the second semiconductor portion 12b may be formed by introducing an impurity of the second conductivity type.

Thereafter, the second electrode 52 is formed. The second electrode 52 is electrically connected to the third semiconductor region 13. The second electrode 52 may be electrically connected to the second semiconductor portion 12b.

The sixth semiconductor region 16 of the second conductivity type and the first electrode 51 are formed. The sixth semiconductor region 16 is located between the first electrode 51 and the first semiconductor region 11. By such a method, the semiconductor device 110 can be manufactured.

In the embodiment, the forming the fourth partial region 15d of the fifth semiconductor region 15 and the forming the fifth partial region 15e of the fifth semiconductor region 15 are performed separately. Impurity concentrations in these regions can be appropriately set. The semiconductor device capable of obtaining stable characteristics can be efficiently manufactured.

In the embodiment, at least one of the first electrode 51 or the second electrode 52 includes at least one selected from the group consisting of, for example, Al, Ti, Ni, W, and Au. The third electrode 53 may include, for example, polysilicon. The insulating member 40 may include, for example, silicon and oxygen. The insulating member 40 may include, for example, silicon oxide.

In the embodiments, information about length and thickness can be obtained, by electron microscopy and the like. In the embodiments, the impurity concentration may be a carrier concentration. In the embodiments, the impurity concentration may be the concentration corresponding to the doping amount of the impurity. Information on the distribution and value of the impurity concentration in the semiconductor regions is obtained, for example, by secondary ion mass spectrometry (SIMS). The relative relationship between the impurity concentrations in the two semiconductor regions may be determined using, for example, a scanning capacitance microscopy (SCM). Information on the distribution and values of impurity concentrations may be obtained, for example, by spreading resistance analysis (SRA). The SCM and SRA provide, for example, information on the relative relationship and the value of the carrier concentration in the semiconductor regions. For example, by assuming the activation rate of the impurity, the measurement results of SCM and SRA may provide information on at least one of the relative relationship between the impurity concentrations of the two semiconductor regions, the distribution of the impurity concentrations, or the value of the impurity concentrations.

Configuration 1

A semiconductor device, comprising:
 a first electrode;
 a second electrode, a direction from the first electrode to the second electrode being along a first direction;
 a third electrode being located between the first electrode and the second electrode;
 a semiconductor member, the semiconductor member including:
  a first semiconductor region of a first conductivity type, the first semiconductor region including a first partial region, a second partial region, and a third partial region, the first partial region being between the first electrode and the third electrode in the first direction, a second direction from the first partial region to the second partial region crossing the first direction, the third partial region being between the second partial region and the second electrode in the first direction,
  a second semiconductor region of a second conductivity type, the second semiconductor region being provided between the third partial region and the second electrode, the second semiconductor region including a first semiconductor portion,
  a third semiconductor region of the first conductivity type, the third semiconductor region being provided between the first semiconductor portion and the second electrode, and being electrically connected to the second electrode;
  a fourth semiconductor region of the first conductivity type, the fourth semiconductor region being provided between the third partial region and the second semiconductor region in the first direction,
  a fifth semiconductor region of the second conductivity type, the fifth semiconductor region including a fourth partial region and a fifth partial region, the fourth partial region being located between the first partial region and the third electrode in the first direction, the fifth partial region being located between the third partial region and the fourth semiconductor region in the first direction, a direction from a part of the third electrode to the fifth partial region being along the second direction, the fifth partial region being continuous with the fourth partial region,
  a sixth semiconductor region of the second conductivity type, the sixth semiconductor region being provided between the first electrode and the first semiconductor region; and
 an insulating member including a first insulating region, the first insulating region being provided between the semiconductor member and the third electrode.

Configuration 2

The semiconductor device according to Configuration 1, wherein
 the semiconductor member including a first boundary and a second boundary,
 the first boundary being located between the first partial region and the fourth partial region in the first direction,
 the second boundary being located between the third partial region and the fifth partial region in the first direction, and
 a first distance between the first electrode and the first boundary along the first direction being shorter than a second distance between the first electrode and the second boundary along the first direction.

Configuration 3

The semiconductor device according to Configuration 2, wherein an impurity concentration of the second conductivity type in at least a part of the fourth partial region is higher than an impurity concentration of the second conductivity type in at least a part of the fifth partial region.

Configuration 4

A semiconductor device, comprising:
 a first electrode;
 a second electrode, a direction from the first electrode to the second electrode being along a first direction;
 a third electrode being located between the first electrode and the second electrode;
 the semiconductor member, the semiconductor member including:
  a first semiconductor region of a first conductivity type, the first semiconductor region including a first partial region, a second partial region, and a third partial region, the first partial region being located between the first electrode and the third electrode in the first direction, a second direction from the first partial region to the second partial region crossing the first direction, the third partial region being located between the second partial region and the second electrode in the first direction,
  a second semiconductor region of a second conductivity type, the second semiconductor region being provided between the third partial region and the second electrode, the second semiconductor region including a first semiconductor portion,
  a third semiconductor region of the first conductivity type, the third semiconductor region being provided between the first semiconductor portion and the second electrode, and being electrically connected to the second electrode,
  a fourth semiconductor region of the first conductivity type, the fourth semiconductor region being provided between the third partial region and the second semiconductor region in the first direction,
  a fifth semiconductor region of the second conductivity type, the fifth semiconductor region includes a fourth partial region and a fifth partial region, the fourth partial region being located between the first electrode and the third electrode in the first direction, the fifth partial region being located between the third semiconductor region and the fourth semiconductor region in the first direction, a direction from a part of the third electrode to the fifth partial region being along the second direction, a impurity concentration of the second conductivity type in at least a part of the fourth partial region being higher than an impurity concentration of the second conductivity type in at least a part of the fifth partial region, and a sixth semiconductor region of the second conductivity type, the sixth semiconductor region being provided between the first electrode and the first semiconductor region; and an insulating member including a first insulating region, the first insulating region being provided between the semiconductor member and the third electrode.

Configuration 5

The semiconductor device according to Configuration 3 or 4, wherein
the fourth partial region includes a first position and a third position,
the fifth partial region includes a second position,
the first position is between the first partial region and the third electrode in the first direction,
the third position is between the first position and the third electrode in the first direction,
a direction from the third position to the second position is along the second direction,
a first position impurity concentration of the second conductivity type at the first position is higher than a second position impurity concentration of the second conductivity type at the second position, and
a third position impurity concentration of the second conductivity type at the third position is lower than the first position impurity concentration.

Configuration 6

The semiconductor device according to Configuration 5, wherein the first position impurity concentration is not less than 1.5 times and not more than 100 times the second position impurity concentration.

Configuration 7

The semiconductor device according to Configuration 5, wherein the third position impurity concentration is lower than the second position impurity concentration.

Configuration 8

The semiconductor device according to Configuration 6 or 7, wherein an impurity concentration of the second conductivity type in the fourth partial region is highest at the first position in the first direction.

Configuration 9 The semiconductor device according to Configuration 8, wherein
the fifth partial region includes a fourth position,
a direction from the fourth position to the second position is along the first direction,
a direction from the first position to the fourth position is along the second direction, and
the second position impurity concentration is higher than a fourth position impurity concentration of the second conductivity type at the fourth position.

Configuration 10

The semiconductor device according to Configuration 9, wherein the first position impurity concentration is not less than 2 times and not more than 1000 times the fourth position impurity concentration.

Configuration 11 The semiconductor device according to any one of Configurations 1 to 10, wherein
the first insulating region further includes a second insulating portion, and
the second insulating portion is provided between the third electrode and the third semiconductor region, between the third electrode and the second semiconductor region, between the third electrode and the fourth semiconductor region, and between the third electrode and the fifth partial region in the second direction.

Configuration 12

The semiconductor device according to any one of Configurations 1 to 11, wherein a third impurity concentration of the first conductivity type in the third semiconductor region is higher than a first impurity concentration of the first conductivity type in the first semiconductor region.

Configuration 13

The semiconductor device according to any one of Configurations 1 to 11, wherein a fourth impurity concentration of the first conductivity type in the fourth semiconductor region is higher than a first impurity concentration of the first conductivity type in the first semiconductor region.

Configuration 14

The semiconductor device according to any one of Configurations 1 to 13, wherein
the second semiconductor region further includes a second semiconductor portion,
the third semiconductor region is located between the third electrode and the second semiconductor portion in the second direction, and
the second semiconductor portion is electrically connected to the second electrode.

Configuration 15

The semiconductor device according to Configuration 14, wherein a second semiconductor portion impurity concentration of the second conductivity type in the second semiconductor portion is higher than a first semiconductor portion impurity concentration of the second conductivity type in the first semiconductor portion.

Configuration 16

The semiconductor device according to any one of Configurations 1 to 15, wherein a sixth impurity concentration of the second conductivity type in the sixth semiconductor region is higher than a fifth impurity concentration of the second conductivity type in the fifth semiconductor region.

Configuration 17

The semiconductor device according to any one of Configurations 1 to 16, wherein
the insulating member further includes a second insulating region, and
the second insulating region is located between the third electrode and the second electrode in the first direction.

Configuration 18

The semiconductor device according to any one of Configurations 1 to 17, wherein
a plurality of the third electrodes is provided, and
a direction from one of the plurality of third electrodes to another one of the plurality of third electrodes is along the second direction.

Configuration 19

A semiconductor device, comprising:
a collector electrode;
a semiconductor member provided on the collector electrode; and
a gate electrode provided in a trench provided in the semiconductor member,
the semiconductor member including:
a first semiconductor region of a first conductivity type, and a fifth semiconductor region of a second conductivity type provided around a bottom of the trench,
the first semiconductor region being located between the collector electrode and the fifth semiconductor region,
the fifth semiconductor region including a first portion and a second portion, the first portion being below the trench, the second portion being a portion other than the first portion, and
a first distance being lower than a second distance, the first distance being between a first boundary and the collector electrode, the first boundary being between the first portion and the first semiconductor region, the second distance being between a second boundary and the collector electrode, the second boundary being between the second portion and the first semiconductor region.

Configuration 20

A method for manufacturing a semiconductor device, the method comprising:
introducing an impurity of a second conductivity type into a bottom portion of a trench provided in a first semiconductor member serving as a first semiconductor region of a first conductivity type;
forming an insulating member inside the trench;
burying a conductive member in a remaining space inside the trench to form a third electrode;
introducing an impurity of the second conductivity type and an impurity of the first conductivity type into a part of another portion of the first semiconductor member to form a fifth semiconductor region of the second conductivity type, a fourth semiconductor region of the first conductivity type, a second semiconductor region of the second conductivity type, and a third semiconductor region of the first conductivity type, the fourth semiconductor region being located above the fifth semiconductor region, the second semiconductor region being above the fourth semiconductor region, the third semiconductor region being located above at least a part of the second semiconductor region;
forming a second electrode electrically connected to the third semiconductor region; and
forming first electrode and a sixth semiconductor region of the second conductivity type, the sixth semiconductor region being located between the first electrode and the first semiconductor region.

According to the embodiment, a semiconductor device capable of obtaining stable characteristics and a method for manufacturing the same can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices and methods for manufacturing the same practicable by an appropriate design modification by one skilled in the art based on the semiconductor devices and methods for manufacturing the same described above as embodiments of the invention also are within the scope of the invention to the extent that the purport of the invention are included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
a collector electrode;
an emitter electrode, a direction from the collector electrode to the emitter electrode being along a first direction;
a plurality of gate electrodes being located between the collector electrode and the emitter electrode;
a semiconductor member, the semiconductor member including:
a first semiconductor region of a first conductivity type, the first semiconductor region including a first partial region, a second partial region, and a third partial region, the first partial region being between the collector electrode and the gate electrodes in the first direction, a second direction from the first partial region to the second partial region being perpendicular to the first direction, the third partial region being between the second partial region and the emitter electrode in the first direction,
a second semiconductor region of a second conductivity type, the second semiconductor region being provided between the third partial region and the emitter electrode, the second semiconductor region including a first semiconductor portion,
a third semiconductor region of the first conductivity type, the third semiconductor region being provided between the first semiconductor portion and the emitter electrode, and being electrically connected to the emitter electrode;
a fourth semiconductor region of the first conductivity type, the fourth semiconductor region being provided between the third partial region and the second semiconductor region in the first direction,
a fifth semiconductor region of the second conductivity type, the fifth semiconductor region including a fourth partial region and a fifth partial region, the fourth partial region being located between the first partial region and the gate electrodes in the first direction, the fifth partial region being located between the third partial region and the fourth semiconductor region in the first direction, the fifth partial region being continuous with the fourth partial region, and
a sixth semiconductor region of the second conductivity type, the sixth semiconductor region being provided between the collector electrode and the first semiconductor region; and an insulating member including a first insulating region, the first insulating region being provided between the semiconductor member and each of the gate electrodes, wherein the gate electrodes are aligned in the second direction, wherein the second semiconductor region, the fourth semiconductor region, and the fifth partial region are located between the gate electrodes in the second direction, and wherein the fifth partial region has a peak of impurity concentration of the second conductivity type in the first direction, the peak being located between the gate electrodes in the second direction.

2. The semiconductor device according to claim 1, wherein the semiconductor member includes a first boundary and a second boundary, the first boundary being located between the first partial region and the fourth partial region in the first direction, the second boundary being located between the third partial region and the fifth partial region in the first direction, and a first distance between the collector electrode and the first boundary along the first direction being shorter than a second distance between the collector electrode and the second boundary along the first direction.

3. The semiconductor device according to claim 2, wherein an impurity concentration of the second conductivity type in at least a part of the fourth partial region is higher than an impurity concentration of the second conductivity type in at least a part of the fifth partial region.

4. A device, comprising:

a collector electrode;

an emitter electrode, a direction from the collector electrode to the emitter electrode being along a first direction;

a plurality of gate electrodes being located between the collector electrode and the emitter electrode;

a semiconductor member, the semiconductor member including:

a first semiconductor region of a first conductivity type, the first semiconductor region including a first partial region, a second partial region, and a third partial region, the first partial region being located between the collector electrode and the gate electrodes in the first direction, a second direction from the first partial region to the second partial region crossing the first direction, the third partial region being located between the second partial region and the emitter electrode in the first direction, a second semiconductor region of a second conductivity type, the second semiconductor region being provided between the third partial region and the emitter electrode, the second semiconductor region including a first semiconductor portion, a third semiconductor region of the first conductivity type, the third semiconductor region being provided between the first semiconductor portion and the emitter electrode, and being electrically connected to the emitter electrode, a fourth semiconductor region of the first conductivity type, the fourth semiconductor region being provided between the third partial region and the second semiconductor region in the first direction, a fifth semiconductor region of the second conductivity type, the fifth semiconductor region includes a fourth partial region and a fifth partial region, the fourth partial region being located between the collector electrode and the gate electrodes in the first direction, the fifth partial region being located between the third semiconductor region and the fourth semiconductor region in the first direction, a direction from a part of the gate electrodes to the fifth partial region being along the second direction, an impurity concentration of the second conductivity type in at least a part of the fourth partial region being higher than an impurity concentration of the second conductivity type in at least a part of the fifth partial region, and a sixth semiconductor region of the second conductivity type, the sixth semiconductor region being provided between the collector electrode and the first semiconductor region; and an insulating member including a first insulating region, the first insulating region being provided between the semiconductor member and each of the gate electrodes, wherein the gate electrodes are aligned in the second direction, wherein the second semiconductor region, the fourth semiconductor region, and the fifth partial region are located between the gate electrodes in the second direction, and wherein the fifth partial region has a peak of impurity concentration of the second conductivity type in the first direction, the peak being located between the gate electrodes in the second direction.

5. The semiconductor device according to claim 3, wherein the fourth partial region includes a first position and a third position, the fifth partial region includes a second position, the first position is between the first partial region and one of the gate electrodes in the first direction, the third position is between the first position and the one gate electrode in the first direction, a direction from the third position to the second position is along the second direction, a first position impurity concentration of the second conductivity type at the first position is higher than a second position impurity concentration of the second conductivity type at the second position, and a third position impurity concentration of the second conductivity type at the third position is lower than the first position impurity concentration.

6. The semiconductor device according to claim 5, wherein the first position impurity concentration is not less than 1.5 times and not more than 100 times the second position impurity concentration.

7. The semiconductor device according to claim 5, wherein the third position impurity concentration is lower than the second position impurity concentration.

8. The semiconductor device according to claim 6, wherein an impurity concentration of the second conductivity type in the fourth partial region is highest at the first position in the first direction.

9. The semiconductor device according to claim 8, wherein the fifth partial region includes a fourth position, a direction from the fourth position to the second position is along the first direction, a direction from the first position to the fourth position is along the second direction, and the second position impurity concentration is higher than a fourth position impurity concentration of the second conductivity type at the fourth position.

10. The semiconductor device according to claim 9, wherein the first position impurity concentration is not less than 2 times and not more than 1000 times the fourth position impurity concentration.

11. The semiconductor device according to claim 1, wherein
the first insulating region further includes a second insulating portion, and
the second insulating portion is provided between the gate electrodes and the third semiconductor region, between the gate electrodes and the second semiconductor region, between the gate electrodes and the fourth semiconductor region, and between the gate electrodes and the fifth partial region in the second direction.

12. The semiconductor device according to claim 1, wherein a third impurity concentration of the first conductivity type in the third semiconductor region is higher than a first impurity concentration of the first conductivity type in the first semiconductor region.

13. The semiconductor device according to claim 1, wherein a fourth impurity concentration of the first conductivity type in the fourth semiconductor region is higher than a first impurity concentration of the first conductivity type in the first semiconductor region.

14. The semiconductor device according to claim 1, wherein
the second semiconductor region further includes a second semiconductor portion,
the third semiconductor region is located between the gate electrodes and the second semiconductor portion in the second direction, and
the second semiconductor portion is electrically connected to the emitter electrode.

15. The semiconductor device according to claim 14, wherein a second semiconductor portion impurity concentration of the second conductivity type in the second semiconductor portion is higher than a first semiconductor portion impurity concentration of the second conductivity type in the first semiconductor portion.

16. The semiconductor device according to claim 1, wherein a sixth impurity concentration of the second conductivity type in the sixth semiconductor region is higher than a fifth impurity concentration of the second conductivity type in the fifth semiconductor region.

17. The semiconductor device according to claim 1, wherein
the insulating member further includes a second insulating region, and
the second insulating region is located between the gate electrodes and the emitter electrode in the first direction.

* * * * *